United States Patent
Gomez et al.

(10) Patent No.: US 7,295,250 B2
(45) Date of Patent: Nov. 13, 2007

(54) APPARATUS AND METHOD FOR RESTORING DC SPECTRUM FOR ANALOG TELEVISION RECEPTION USING DIRECT CONVERSION TURNERS

(75) Inventors: Ramon A Gomez, San Juan Capistrano, CA (US); Myles Wakayama, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 757 days.

(21) Appl. No.: 10/630,656

(22) Filed: Jul. 31, 2003

(65) Prior Publication Data

US 2005/0024541 A1 Feb. 3, 2005

(51) Int. Cl.
*H04N 5/21* (2006.01)
*H04N 5/16* (2006.01)

(52) U.S. Cl. ....................... 348/691; 348/607

(58) Field of Classification Search ................ 348/607, 348/624, 691, 692, 697; 455/323, 131, 141, 455/313, 315, 316, 318, 324, 234.1, 240.1, 455/207; 375/324, 319, 316, 344; *H04N 5/21, H04N 5/16, 9/72*
See application file for complete search history.

(56) References Cited

U.S. PATENT DOCUMENTS

| | | |
|---|---|---|
| 4,340,975 A | 7/1982 | Onishi et al. |
| 5,200,826 A | 4/1993 | Seong |
| 5,737,035 A | 4/1998 | Rotzoll |

(Continued)

FOREIGN PATENT DOCUMENTS

EP 0719013 A2 6/1996

(Continued)

OTHER PUBLICATIONS

Copy of International Search Report for Appln. No. EP 04010937.3 issued Aug. 19, 2004, 3 pages.

(Continued)

*Primary Examiner*—Sherrie Hsia
(74) *Attorney, Agent, or Firm*—Sterne, Kessler, Goldstein & Fox P.L.L.C.

(57) ABSTRACT

A DC compensation circuit restores the frequency spectrum of an input signal at DC (or 0 Hz) by removing or reducing DC offset, 1/f noise, or any other unwanted noise at or near 0 Hz. The DC compensation is performed using direct coupling, as opposed to AC coupling, so that no useful signal information in the active period of the input signal is lost at DC. The DC compensation circuit samples the input signal during an inactive period of the input signal. Afterwhich, the unwanted DC noise is determined from the sampled signal and stored until an active period of the input signal. For example, the sampled signal can be filtered using a passband around DC so as to isolate the signal energy at DC during the inactive period. Since there is no useful signal information present during the inactive period, any signal energy at the output of the filter is necessarily unwanted DC noise. In a feed-forward approach, the unwanted DC noise is then subtracted from the input signal during the active period of the input signal to compensate or cancel the unwanted DC noise. Alternatively, the unwanted DC noise could be sampled and determined during the inactive period and then fed back (after filtering) in order to be subtracted during the active period of the input signal.

24 Claims, 6 Drawing Sheets

U.S. PATENT DOCUMENTS

| | | | |
|---|---|---|---|
| 5,847,612 A | 12/1998 | Birleson | |
| 5,930,696 A | 7/1999 | Tzuang et al. | |
| 6,009,317 A | 12/1999 | Wynn | |
| 6,160,572 A | 12/2000 | Matsuura | |
| 6,163,684 A | 12/2000 | Birleson | |
| 6,175,728 B1 * | 1/2001 | Mitama | 455/323 |
| 6,484,042 B1 | 11/2002 | Loke | |
| 7,038,733 B2 * | 5/2006 | Dent | 348/614 |

FOREIGN PATENT DOCUMENTS

| | | |
|---|---|---|
| EP | 0840484 A2 | 5/1998 |
| EP | 0863606 A1 | 9/1998 |
| EP | 0948128 A1 | 10/1999 |
| EP | 0964557 A1 | 12/1999 |
| EP | 1063767 A2 | 12/2000 |
| EP | 1172928 A2 | 1/2002 |

OTHER PUBLICATIONS

Aschwanden, Felix, "*Direct Conversion—How to Make It Work in TV Tuners,*" IEEE Transactions on Consumer Electronics, Aug. 1996, pp. 729-738, vol. 42, No. 3, (ISSN 0098-3063).

* cited by examiner

RF INPUT

I OUTPUT

Q OUTPUT

I OUTPUT
(BLANKING)

Q OUTPUT
(BLANKING)

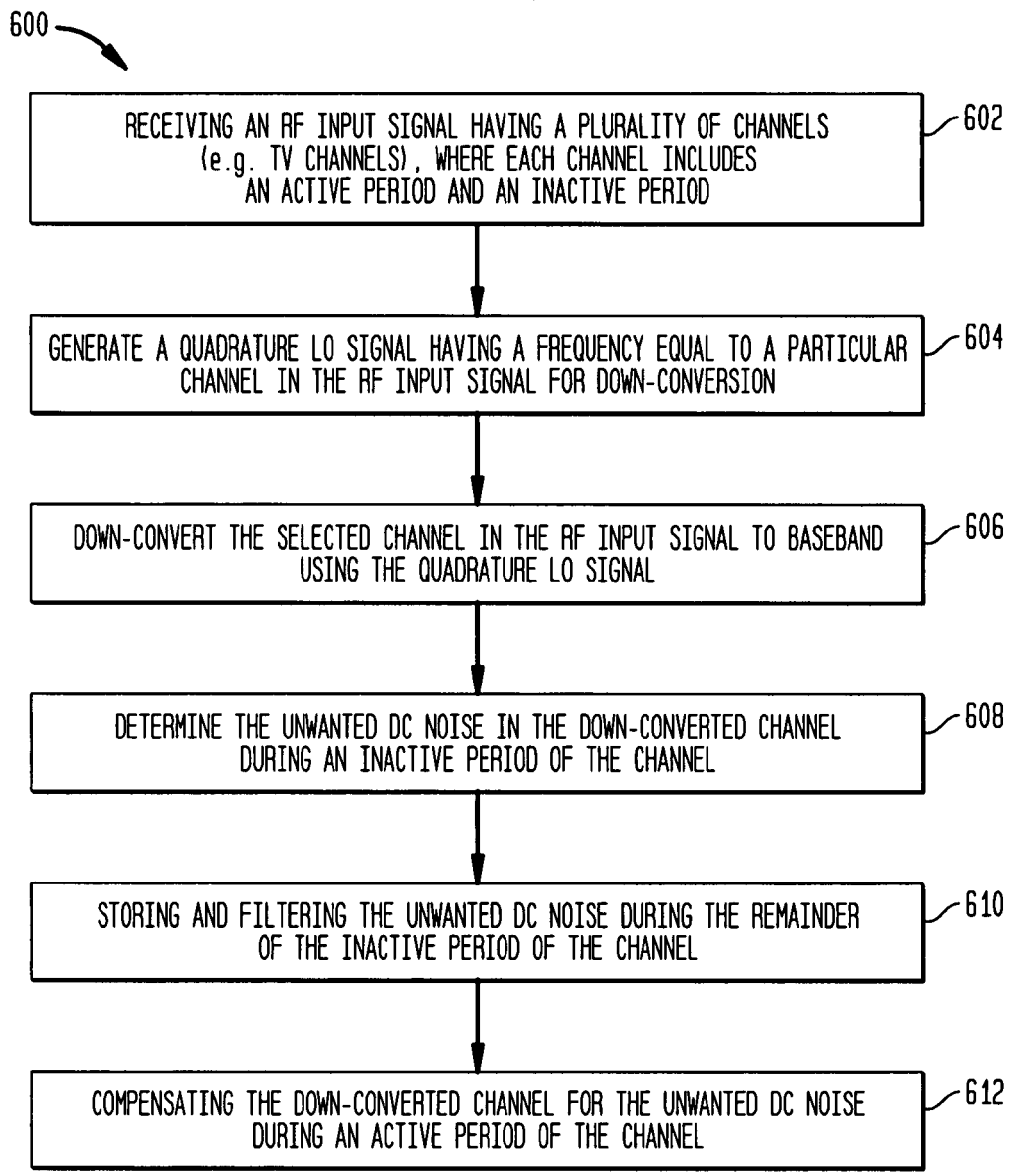

APPARATUS AND METHOD FOR RESTORING DC SPECTRUM FOR ANALOG TELEVISION RECEPTION USING DIRECT CONVERSION TURNERS

BACKGROUND OF THE INVENTION

1. Field of the Invention

The present invention generally relates to restoring DC spectrum for analog televison signals in direct conversion receivers. More specifically, the present invention relates to correcting DC offset and 1/f noise, or other unwanted DC noise in analog TV signals.

2. Background Art

Direct-conversion, or homodyne receivers are popular for many communications applications because of their simplicity and low power. They do not require intermediate-frequency (IF) filters, which are often costly, and need only one frequency conversion stage and one local oscillator (LO). By comparison, dual conversion receivers necessarily require two frequency conversion stages, and two different local oscillators. Therefore, the dual conversion receivers consume more power and have a higher part count than direct-conversion receivers.

Direct-conversion receivers rely entirely on quadrature mixing to obtain the necessary image rejection. Single-conversion low-IF receivers for broadband communication systems, such as direct broadcast satellite (DBS), broadcast or cable television (CATV), may rely on some combination of quadrature conversion and pre-selection with tracking or switched filters. By comparison, double-conversion receivers for these applications rely more on IF filtering for image rejection. Because the IF frequencies can be fixed, very sharp filters, such as surface acoustic wave (SAW) filters, need to be used in the dual conversion receiver. However, these filters are relatively costly and prevent the implementation of a truly integrated single chip solution.

In relation to DC offset compensation, a disadvantage of direct-conversion receivers is that some point in the middle of the desired channel spectrum is down-converted to 0 Hz, or DC. In other words, the direct conversion translates useful information directly to DC. However, DC offset voltages and 1/f noise also co-exist at DC with the useful information, which impairs the signal-to-noise ratio around DC. Blocking capacitors (AC coupling) can be used to reduce or eliminate DC Offset voltages and 1/f noise. However, blocking capacitors necessarily introduce a null in signal energy at DC. Therefore, useful signal information at DC is eliminated along with the unwanted DC Offset by the blocking capacitor. The DC null is acceptable for some communications systems. However, the DC null is unacceptable for analog TV signals because it would degrade the video signal below that which a viewer would find acceptable.

What is needed is a technique to compensate for DC offset in a direct conversion receiver that does not null the signal energy during an active portion of the input signal, so as to enable direct conversion of analog television signals without impairing viewing quality.

BRIEF SUMMARY OF THE INVENTION

The present invention is a DC compensation circuit that restores the frequency spectrum of an input signal at DC (or 0 Hz) by removing or reducing any DC offset, 1/f noise, or any other unwanted noise at or near 0 Hz. The DC compensation is performed without nulling the input signal spectrum at 0 Hz (or DC) of the input signal, so that no signal information is lost at 0 Hz during an active period of the input signal. In other words, the DC compensation is performed using direct coupling, as opposed to AC coupling, so that no useful signal information is lost at DC during the active period of the input signal. In one embodiment, the input signal is a channel that is selected and down-converted from an RF input signal having a plurality of channels. For example, the input signal can be a down-converted TV channel having a continuous spectrum from 0-3 MHz, or −3 to 3 MHz considering both in-phase and quadrature components during active portions of the TV signal. Analog TV signals include an active period and inactive period when examined over time. The active period carries useful channel information, and the inactive period allows the TV screen to re-trace, which is known as horizontal blanking or horizontal sync. The DC compensation is performed such that the unwanted DC noise is determined during the inactive period of the TV signal and not the active period, which is advantageous since the active period carries the useful channel information.

The DC compensation circuit samples the input signal during the inactive period of the input signal. After which, the unwanted DC noise is determined from the sampled signal and stored until the active period of the input signal returns. For example, the sampled signal can be filtered using a passband around DC so as to isolate the signal energy at DC during the inactive period of the input signal. Since there is no useful signal information present during the inactive period, any signal energy at the output of the filter is necessarily unwanted DC noise. In a feed-forward approach, the unwanted DC noise is then subtracted from the input signal during active portion of the input signal to compensate or cancel the unwanted DC noise, which can include DC offset, 1/f noise, or any other unwanted noise. Alternatively, the unwanted DC noise could be sampled and determined during the inactive portion and then fed back (after filtering) in order to be subtracted during the active portion of the input signal.

The DC compensation circuit is directly coupled and does not introduce a DC null in the signal spectrum of the input signal, as would occur for an AC coupled configuration. This is advantageous for analog TV signals that carry useful information at DC, as this useful information would be lost if the signal spectrum was nulled at DC. Furthermore, the input signal is sampled during the inactive period of the input signal to determine the unwanted DC noise, leaving the useful signal information undisturbed during the active period. For instance, with analog TV signals, the input signal is sampled during the horizontal blanking period, which carries no useful signal information.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 6 illustrates direct conversion of an analog TV signal with DC offset compensation according to embodiments of the present invention.

DETAILED DESCRIPTION OF THE INVENTION

Figure 1:
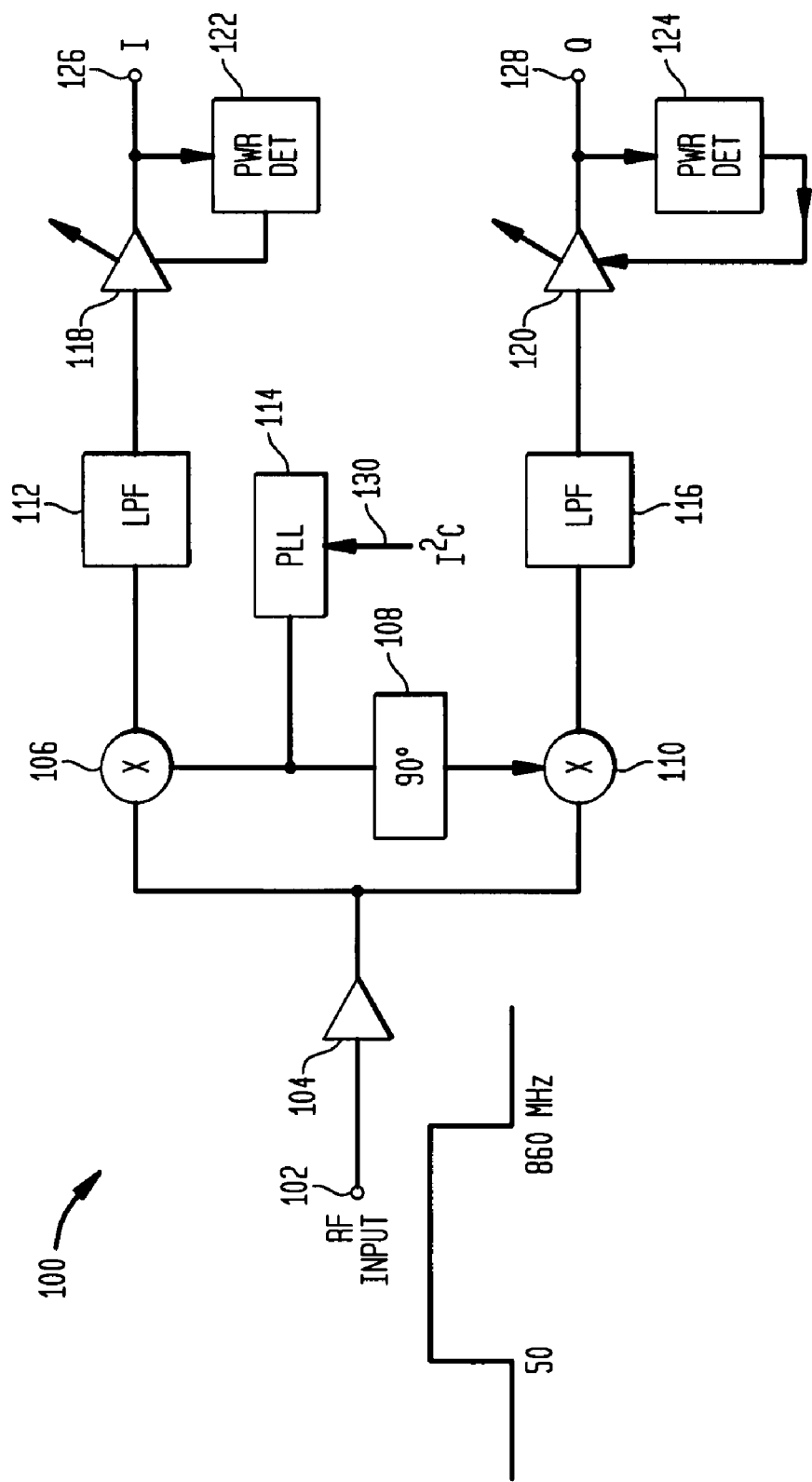
FIG. 1 illustrates an IQ direct conversion receiver.
Figure 2A:
FIG. 2A illustrates an RF input signal for a TV signal prior to down-conversion and channel selection.

FIG. 1 illustrates an IQ direct conversion receiver 100 that down-converts an RF input 102 to an I baseband signal 126 and a Q baseband signal 128. In one embodiment, the RF input signal 102 is an analog television signal 102 having a plurality of TV channels that occupy the frequency spectrum from approximately 50 MHz to 860 MHz, as shown in FIG. 2A. In North America, each TV channel is typically 6 MHz wide, and in Europe, each TV channel is typically 8 MHz wide, but these mentioned channel frequencies are not meant to limit the invention.

The direct conversion tuner includes amplifier 104, mixers 106 and 110, lowpass filters 112 and 116, a phase lock loop (PLL) 114, a 90 degree phase shifter 108, variable amplifiers 118 and 120, and power detectors 122 and 124. The direct conversion receiver 100 performs a single frequency conversion to select and down-convert a desired or selected channel from RF input signal 102. In doing so, the amplifier 104 receives and amplifies the RF input signal 102 having the plurality of TV channels. The mixers 106 and 110 both receive the RF input signal 102 from the amplifier 104 and also receive a local oscillator signal from the PLL 114. For direct conversion, the frequency of the PLL 114 is tuned to the frequency of the desired channel in the RF input signal 102 that is to be selected and viewed. For example, if the desired channel in the RF input signal 102 is at 100 MHz, then the PLL 114 is tuned to 100 MHz, so that the mixers 106 and 110 down-convert the desired channel in the RF signal 102 to DC. In the Q channel, the local oscillator from the PLL 114 is phase-shifted by 90 degrees to generate the Q baseband signal 128.

In TV and cable tuners, the PLL 114 can be controlled by a control signal 130 so to tune the frequency of the LO signal produced by the PLL 114, and thereby control the channel selection that is down-converted to baseband by the mixers 106 and 110. Control signals for tuner control are well known to those skilled in the arts.

The lowpass filter 112 filters the output of the mixer 106 to remove unwanted spurious energy that is above baseband, and the lowpass filter 116 perform the same operation on the output of the mixer 110. The amplifier 118 variably amplifies the filtered output of the lowpass filter 112 to generate the I baseband signal 126, and amplifier 120 variably amplifies the filtered output of the lowpass filter 116 to generate the Q baseband signal 128. The variable amplifier 118 is controlled by the power detector 122 to provide gain and power control of the I baseband signal 126. Likewise, the variable amplifier 120 is controlled by the power detector 124 to provide gain and power control of the Q baseband signal 128. For instance, it may be desirable to set a specific or constant power output for the I and Q baseband signals 126 and 128.

Figure 2B:
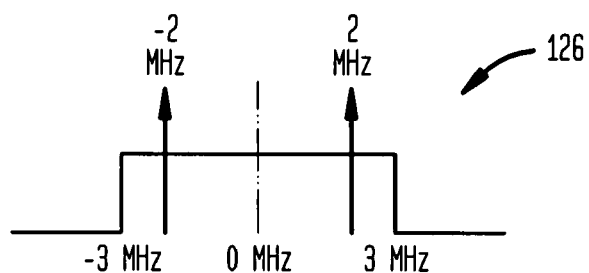
FIGS. 2B-2C illustrate the frequency spectrum of I and Q baseband TV signals during an active period of the TV signal.
Figure 2C:
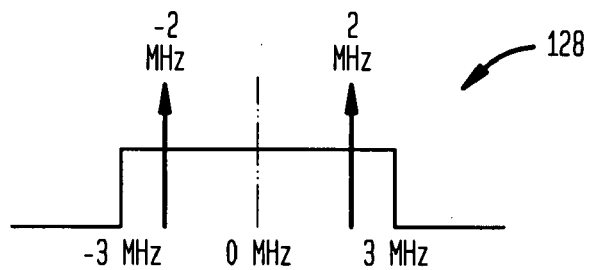

The I and Q baseband signal baseband signals 126 and 128 are centered around 0 Hz and represent a single channel selected and down-converted from the RF input signal 102. For analog TV signals, the I and Q baseband signals 126 and 128 occupy from 0-3 MHz, and typically include a picture carrier at 2 MHz, as shown in FIGS. 2B and 2C. The picture carrier is a pure tone that operates as a reference tone for the rest of the spectrum in the I and Q baseband signals 126 and 128. In other words, other parts of the baseband spectrum can be identified based on its location relative to the 2 MHz picture carrier.

Analog TV signals include an active period and inactive period when examined over time. The active period carries useful channel information, and the inactive period allows the TV screen to re-trace, which is known as horizontal blanking or horizontal sync. During this time, the screen retraces or updates the picture, but this is done at such a rate as to be imperceptible to the human eye.

Figure 2D:
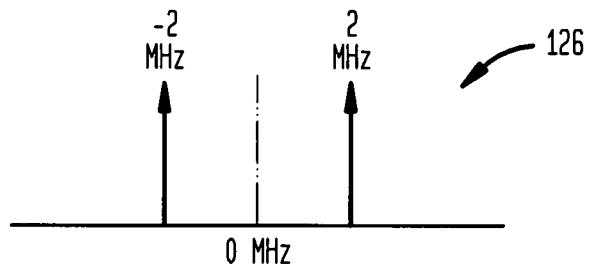
FIGS. 2D-2E illustrate the frequency spectrum of I and Q baseband TV signals during an inactive period of the TV signal.
Figure 2E:
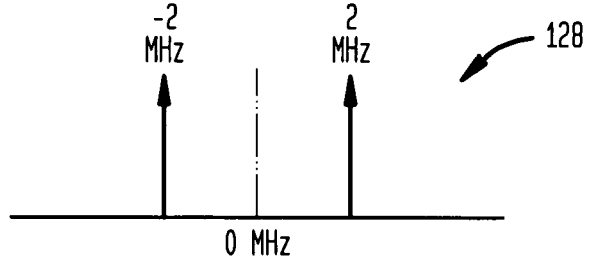

FIGS. 2B and 2C are representative of the active period of the I and Q baseband signals 126 and 128. During the active period, the I and Q baseband signals 126 and 128 are centered around 0 Hz and represent a single channel selected and down-converted from the RF input signal 102. For analog TV signals, the I and Q baseband signals 126 and 128 occupy from 0-3 MHz, and typically include a picture carrier at 2 MHz. FIGS. 2D and 2E represent the inactive period that occurs during horizontal blanking. During the inactive period, the I and Q baseband signals 126 and 128 only carry the picture carrier at 2 MHz, and carry no useful signal information. The spectrums shown in FIGS. 2B-2E are depicted as being symmetrical around 0 Hz, and include the negative frequency periods for mathematical completeness.

During the active periods (FIGS. 2B and 2C), the I baseband signal 126 and the Q baseband signal 128 occupy from −3 MHz to 3 MHz continuously, including spectrum at 0 Hz. However, during the inactive period (FIGS. 2D and 2E), there is no desired signal at 0 Hz. Therefore, this time-period during the inactive period can be used to determine the DC offset voltage and other noise at 0 Hz, since this is the only energy that is present at 0 Hz during this time.

Figure 3:
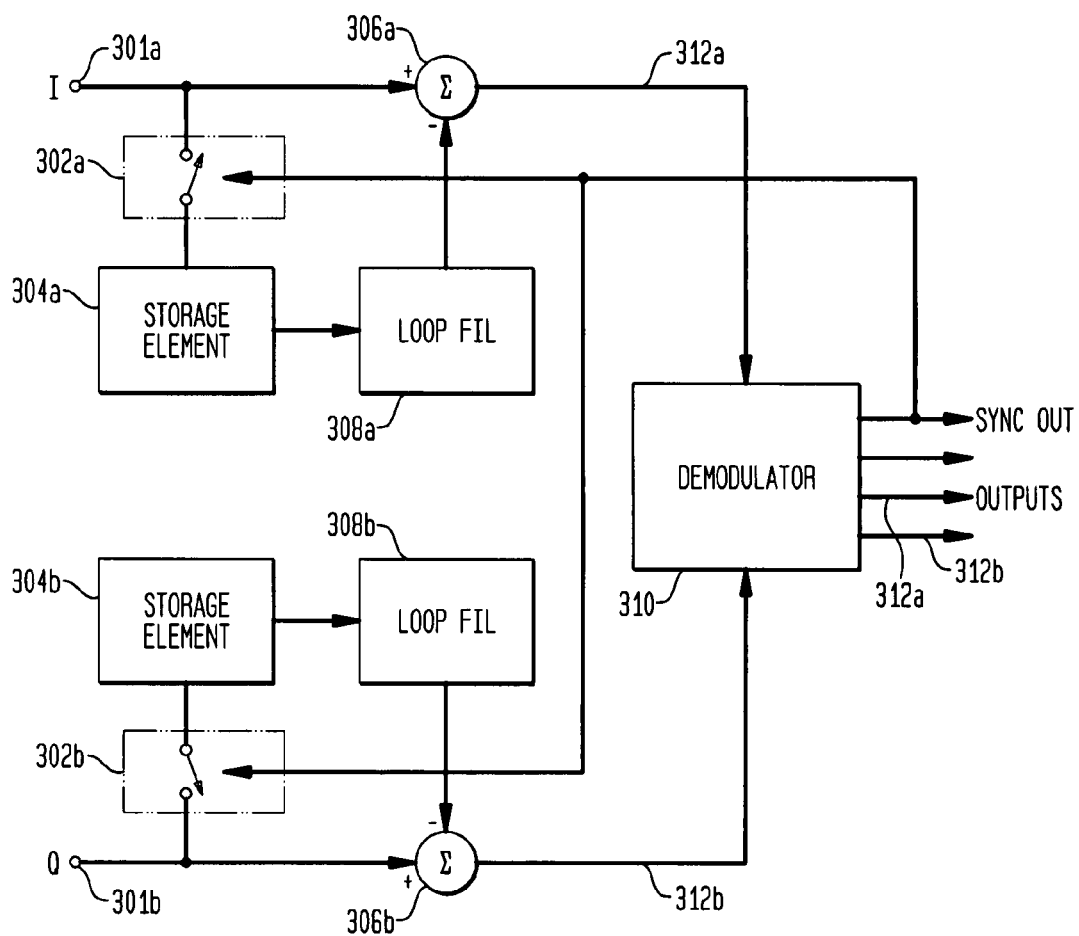
FIG. 3 illustrates a DC compensation circuit 300 according to embodiments of the present invention.

FIG. 3 illustrates a DC compensation circuit 300 according to embodiments of the present invention. The DC compensation circuit 300 restores the frequency spectrum of an input signal by removing any DC offset and any unwanted noise at or near 0 Hz, such as 1/f noise. Furthermore, the DC compensation circuit 300 performs DC compensation without nulling the input signal spectrum during active periods of the input signal, so that no signal information is lost at 0 Hz during the active period of the input signal. Together, the DC offset and the 1/f noise, or any other noise at DC, can be referred to as unwanted DC noise for convenience of discussion.

Figure 4:
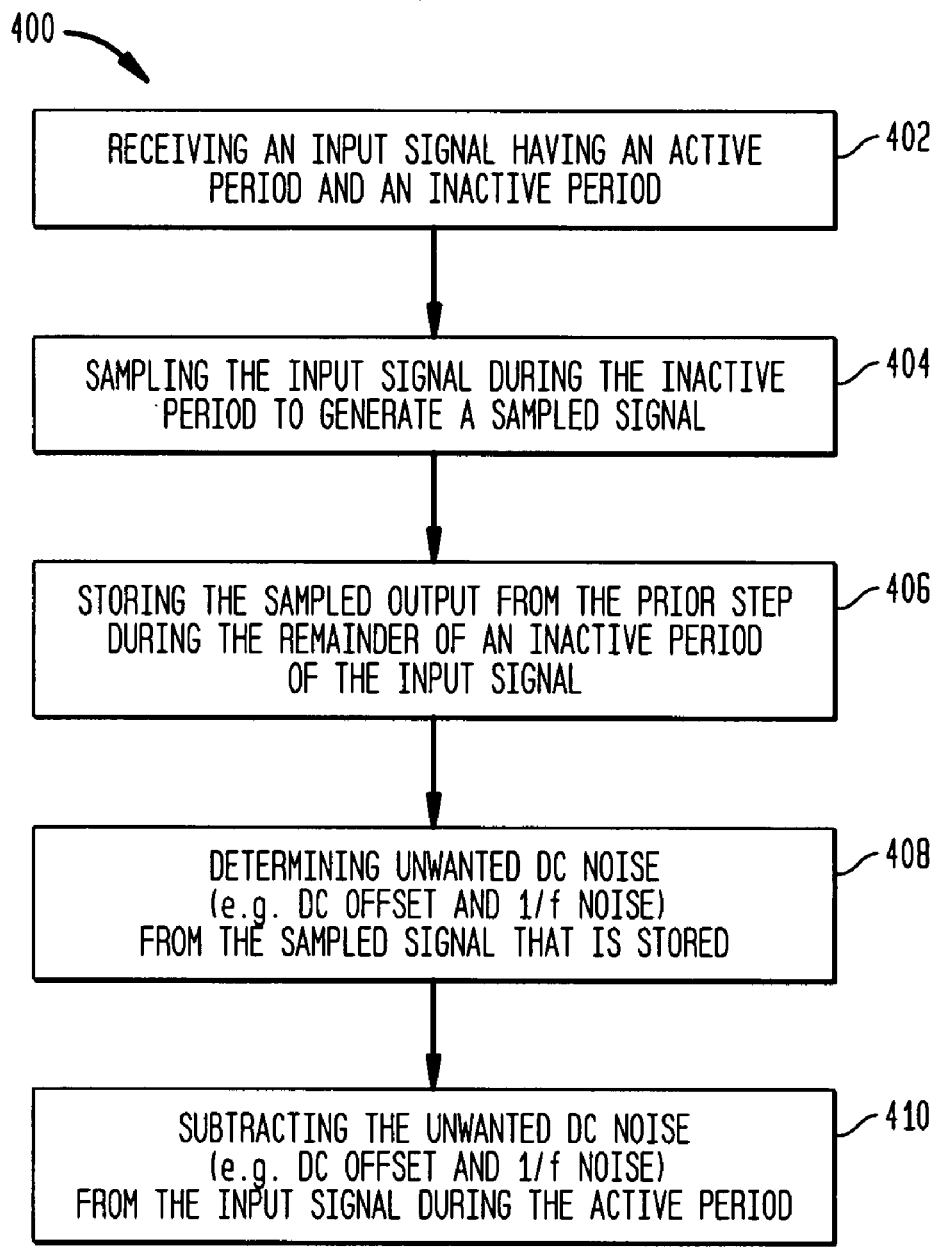
FIG. 4 illustrates a flowchart that further describes DC offset compensation according to embodiments of the present invention.

The DC compensation circuit 300 includes switches 302a and 302b, storage elements 304a and 304b, summers (or combiners) 306a and 306b, loop filters 308a and 308b, and a demodulator 310. The DC compensation circuit 300 is configured to process I and Q baseband signals, such as the I and Q baseband signals 126 and 128 that are generated by the IQ direct conversion receiver 100. As discussed above, in one embodiment, the I and Q baseband signals 126 and 128 represent a down-converted baseband TV channel from a plurality of TV channels in the RF input signal 102. The DC compensation circuit 300 generates an I baseband signal 312a and a Q baseband signal 312b that have reduced DC offset and/or reduced 1/f noise compared to the I and Q baseband signals 126 and 128. The operation of the DC compensation 300 will be further described with reference to the flowchart 400 shown in FIG. 4.

In step 402, the terminals 301a and 301b receive the I and Q baseband signals 126 and 128. As discussed above, the I and Q baseband signals 126 and 128 represent a down-converted analog TV channel having a continuous frequency spectrum. For example, during the active period (or time period) of the TV signal, the I and Q baseband signals 126 and 128 have a frequency spectrum that occupies from −3 MHz to 3 MHz, including information at 0 Hz or DC, as shown in FIGS. 2B and 2C.

In step 404, the switch 302a samples the I baseband signal 126a during an inactive period of the signal. Similarly, the switch 302b samples the Q baseband signal during the inactive period of the signal. For example, for a TV channel, the switches 302a and 302b can sample the respective I and Q baseband signals 126 and 128 during the horizontal blanking period. As shown in FIGS. 2C and 2D, the I and Q baseband signals 126 and 128 carry no signal information during the horizontal blanking period, and only intentionally carry the picture carriers at 2 MHz. However, DC offset and noise may also be present during the horizontal blanking period at 0 Hz. Therefore, the switches 302a and 302b can sample the DC offset and noise at 0 Hz, without interference from the TV channel information that is present during the active periods of the signal.

In step 406, the storage elements 304a and 304b store the respective outputs of the switches 302a and 302b during the remainder of the inactive signal period. For example, the storage element 304a can be a capacitor or other storage device that stores sampled I energy from the switch 302a during the remainder of the inactive period. Likewise, the storage element 304b stores sampled Q energy from the switch 302b during the remainder of the inactive period.

In step 408, the loop filters 308a and 308b isolate the spectrum around 0 Hz to determine the unwanted DC noise (e.g. DC offset and 1/f noise). For example, the loop filter 308a has a passband around 0 Hz that isolates the DC spectrum of the I sampled output of the storage element 304a. Likewise, the loop filter 308b has a passband around 0 Hz that isolates the DC spectrum of the Q sampled output of the storage element 304b. Since the I and Q sampled signals were taken during the inactive signal periods, then the outputs of the filters 308a and 308b represent the unwanted DC noise in the I and Q baseband signals 126 and 128, respectively.

In step 410, the summers/combiners 306a and 306b subtract the unwanted DC noise from the I and Q baseband signals 126a and 126b, to generate I and Q baseband signals 312a and 312b having reduced unwanted DC noise. For example, the summer/combiner 306a subtracts the unwanted DC noise, supplied by the lowpass filter 308a, from the I baseband signal 126 during the active period of the TV signal. Likewise, the summer/combiner 306b subtracts the unwanted DC noise, supplied by the low pass filter 308b, from the Q baseband signal 128 during the active period of the TV signal. The baseband outputs 312a and 312b have reduced DC noise, such as DC offset and reduced 1/f noise. Furthermore, because the unwanted DC noise is sampled and determined during the inactive period of the TV signal, no null is introduced in the baseband signal at DC.

In step 412, the demodulator 310 demodulates the baseband outputs 312a and 312b with reduced baseband noise to generate outputs 314a and 314b.

The DC compensation circuit 300 can be described as a feed-forward configuration because the input baseband signal is sampled during the inactive portion to determine the unwanted DC noise. The unwanted DC noise is then fed forward (after filtering) in order to be subtracted during the active portion of the input baseband signal.

Figure 5:
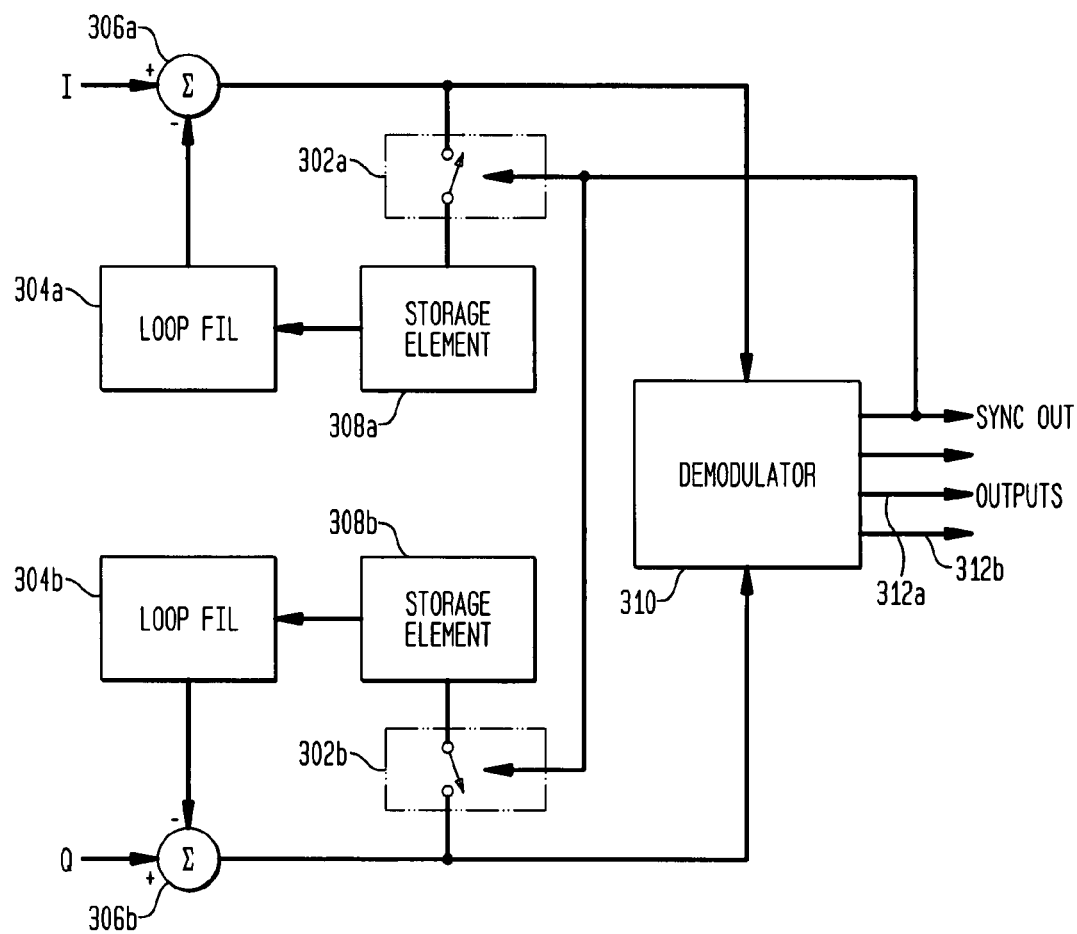
FIG. 5 illustrates a DC compensation circuit 500 that is a feedback configuration for DC offset compensation according to embodiments of the present invention.

Alternatively, the unwanted DC noise could be sampled and determined during the inactive portion and then fed back (after filtering) in order to be subtracted during the active portion of the input baseband signal. For example, the DC compensation circuit 500 in FIG. 5 illustrates a feedback configuration, where the unwanted DC noise is sampled and fed back (after filtering) for subtraction from the input baseband signal during the active portion of the input baseband signal. The operation of the DC compensation circuit 500 will be apparent to those skilled in the arts based on the prior discussion of the DC compensation circuit 300. The present invention is not limited to the feed back and feed forward configurations described herein. Those skilled in the arts may recognize other configurations for DC compensation that are within the scope and spirit of the present invention, based on the discussion given herein.

FIG. 6 further describes DC offset compensation for direct conversion of analog TV signals. More specifically, FIG. 6 illustrates a flowchart 600 that describes direct down-conversion of a desired channel in an RF input signal, and then reducing or eliminating unwanted DC noise from the down-converted channel according to embodiments of the present invention. The down-converted channel could be an analog television channel for example.

In step 602, an RF input signal is received having a plurality of TV channels. For example, the RF input signal 102 is illustrated having a plurality of TV channels having a 6 MHz bandwidth, a 8 MHz bandwidth, or some other bandwidth.

In step, 604, a quadrature LO signal is generated having a frequency that is tuned to select a particular channel in the RF input signal for down-conversion to baseband. More specifically, the frequency of the LO signal is set equal to the frequency of the desired channel in the RF input signal that is to be selected and viewed. For example, the PLL 114 generates a quadrature LO signal having a frequency that is set to down-convert a desired channel in the RF input signal 102 using the quadrature mixers 106 and 110. As discussed above, the PLL 114 can be controlled by the control signal 130, as will be understood by those skilled in the arts.

In step 606, the selected channel in the RF input signal is directly down-converted to baseband using the quadrature LO signal. For instance, the selected channel in the RF input signal 102 is directly down-converted to DC by the mixers 106 and 110 using the quadrature LO signal that is generated by the PLL 114, to generate I and Q baseband signals 126 and 128.

In step 608, the unwanted DC noise in the selected baseband channel is determined during an inactive period of the TV signal. For example, the I and Q baseband signals 126 and 128 are sampled during the inactive period of the down-converted TV channel (e.g. the horizontal sync or trace), to determine the unwanted DC noise. The unwanted DC noise can include any DC offset and/or 1/f noise, or other noise that exists in and around 0 Hz.

In step 610, the unwanted DC noise is filtered and stored for the remainder of the inactive period of the down-converted TV channel. For example, the unwanted DC noise is stored and filtered by the storage elements 304 and 308 for the I and Q baseband signals 126 and 128.

In step 612, the selected down-converted channel is compensated for the unwanted noise during an active period of the down-converted channel. For example, the summers/ combiners 306 respectively subtract the unwanted DC noise from the I and Q baseband signals 126 and 128 that represent the down-converted channel, to generate I and Q baseband signals 312a and 312b that have reduced unwanted DC noise, including reduced or eliminated DC offset and l/f noise.

The DC compensation circuits described herein can be implemented using a standard CMOS process, which has the advantages of low cost and low power. Furthermore, the DC compensation circuits described herein can be implemented on a common substrate with a direct conversion receiver or tuner (e.g. receiver 100), or the DC compensation circuits can be implemented on a separate substrate from the receiver.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method of reducing unwanted DC noise of an input signal, comprising:
   receiving an input signal having an active period and an inactive period;
   sampling said input signal during said inactive period to generate a sampled signal;
   determining said unwanted DC noise from said sampled signal, including the step of filtering said sampled signal using a passband that includes 0 Hz so as to isolate said unwanted DC noise; and
   subtracting said unwanted DC noise from said input signal during said active period.

2. The method of claim 1, wherein said input signal is a down-converted channel.

3. The method of claim 2, wherein said down-converted channel is a down-converted television (TV) channel.

4. The method of claim 3, wherein said down-converted TV channel has a continuous frequency spectrum that includes DC.

5. The method of claim 3, wherein said down-converted TV channel has a continuous frequency spectrum from about −3 MHz to 3 MHz.

6. The method of claim 1, wherein said input signal is a down-converted TV channel such that said inactive period occurs during a horizontal blanking period that carries no useful channel information, and wherein said sampling step includes the step of sampling said down-converted TV channel during said horizontal blanking period.

7. The method of claim 6, wherein said step of determining includes the step of storing said unwanted DC noise during said horizontal blanking period.

8. The method of claim 7, wherein said step of subtracting comprises the step of subtracting said unwanted DC noise from said down-converted TV channel during said active period.

9. The method of claim 6, wherein said down-converted TV channel is a quadrature signal having an I baseband signal and a Q baseband signal, and wherein said step of sampling includes the step of sampling said I baseband signal and said Q baseband signal during said horizontal blanking period, to generate an I sampled signal and a Q sampled signal, respectively.

10. The method of claim 9, wherein said step of determining includes the step of filtering said I sampled signal and said Q sampled signal during said horizontal blanking period.

11. The method of claim 9, wherein said step of subtracting includes the step of subtracting said unwanted DC noise from said I baseband signal and said Q baseband signal.

12. The method of claim 1, wherein said unwanted DC noise includes a DC offset voltage.

13. The method of claim 1, wherein said unwanted DC noise includes 1/f noise.

14. A method of processing an RE input signal, comprising:
   receiving an RE input signal having a plurality of channels;
   directly down-converting a desired channel to baseband, said down-converted channel having a continuous frequency spectrum around 0 Hz; and
   compensating said down-converted channel for unwanted DC noise without introducing a spectrum null at approximately 0 Hz, wherein said step of compensating comprises the step of determining the unwanted DC noise by filtering down-converted frequency spectrum around 0 Hz.

15. The method of claim 14, wherein said unwanted DC noise includes at least one of a DC offset voltage and 1/f noise.

16. The method of claim 14, wherein said down-converted channel includes an active period and an inactive period, and further comprising the steps of:
   determining unwanted DC noise of said down-converted channel during said inactive period; and
   compensating said down-converted channel for said unwanted DC noise during said active period.

17. The method of claim 16, wherein said step of compensating comprises the steps of storing said unwanted DC noise during said inactive period, and subtracting said unwanted DC noise from said down-converted channel during said active period.

18. The method of claim 14, wherein said inactive period is a horizontal blanking period, and said step of determining includes the step of determining said unwanted DC noise during said horizontal blanking period, and storing said unwanted DC noise until said horizontal blanking period is complete.

19. The method of claim 14, wherein said down-converted channel is a quadrature signal having an in-phase (I) component and a quadrature (Q) component, and wherein said step of compensating comprises the step of compensating said I component without introducing a DC null around 0 Hz in said I component, and compensating said Q component without introducing a DC null around 0 Hz in said Q component.

20. A compensation circuit to reduce unwanted DC noise in an input signal, comprising:
   an input terminal for receiving an input signal having an active period and an inactive period;
   means for determining unwanted DC noise during said inactive period, wherein said means for determining includes means for sampling said input signal, and means for filtering an output of said means for sampling using a passband that isolates signal spectrum around 0 Hz;

means for subtracting said unwanted DC noise from said input signal during said active period.

21. The compensation circuit of claim 20, wherein said means for subtracting includes a means for subtracting said isolated signal spectrum around 0 Hz from said input signal.

22. A compensation circuit to reduce unwanted DC noise in an input signal having an active period and an inactive period, comprising:

a combiner for subtracting a feedback signal from said input signal during said active period of said input signal;

a switch for sampling an output of said combiner during said inactive period; and a filter having a passband around 0 Hz coupled to an output of said switch and having an output that provides said feedback signal to said combiner.

23. The compensation circuit of claim 22, further comprising a storage element, coupled between said switch output and said filter, wherein said storage element stores said switch output during said inactive period of said input signal.

24. The compensation circuit of claim 22, wherein said unwanted DC noise is at least one of DC offset and 1/f noise.

* * * * *

UNITED STATES PATENT AND TRADEMARK OFFICE
CERTIFICATE OF CORRECTION

| | | |
|---|---|---|
| PATENT NO. | : 7,295,250 B2 | Page 1 of 1 |
| APPLICATION NO. | : 10/630656 | |
| DATED | : November 13, 2007 | |
| INVENTOR(S) | : Ramon A. Gomez et al. | |

It is certified that error appears in the above-identified patent and that said Letters Patent is hereby corrected as shown below:

In the Claims, Claim 14, Column 8, Line 17, the following error is noted: "A method of processing an RE input signal...". It should be corrected to state: -- A method of processing an RF input signal...--.

In the Claims, Claim 14, Column 8, Line 19, the following error is noted: "...receiving an RE input signal...". It should be corrected to state: -- receiving an RF input signal...--.

Signed and Sealed this

Twenty-seventh Day of May, 2008

JON W. DUDAS
*Director of the United States Patent and Trademark Office*